(12) United States Patent
Matsui et al.

(10) Patent No.: US 10,586,727 B2
(45) Date of Patent: Mar. 10, 2020

(54) SUCTION STAGE, LAMINATION DEVICE, AND METHOD FOR MANUFACTURING LAMINATED SUBSTRATE

(71) Applicant: Shibaura Mechatronics Corporation, Yokohama-shi, Kanagawa-ken (JP)

(72) Inventors: Emi Matsui, Yokohama (JP); Konosuke Hayashi, Yokohama (JP); Takahiro Kanai, Yokohama (JP)

(73) Assignee: Shibaura Mechatronics Corporation, Yokohama-shi, Kanagawa-ken (JP)

( * ) Notice: Subject to any disclaimer, the term of this patent is extended or adjusted under 35 U.S.C. 154(b) by 472 days.

(21) Appl. No.: 15/021,516

(22) PCT Filed: Sep. 24, 2014

(86) PCT No.: PCT/JP2014/075274
§ 371 (c)(1),
(2) Date: Mar. 11, 2016

(87) PCT Pub. No.: WO2015/046243
PCT Pub. Date: Apr. 2, 2015

(65) Prior Publication Data
US 2016/0225655 A1    Aug. 4, 2016

(30) Foreign Application Priority Data
Sep. 25, 2013  (JP) .................................. 2013-198584

(51) Int. Cl.
*H01L 21/683* (2006.01)
*H01L 21/67* (2006.01)
(Continued)

(52) U.S. Cl.
CPC .......... *H01L 21/6838* (2013.01); *B32B 37/10* (2013.01); *B32B 37/14* (2013.01); *H01L 21/67092* (2013.01); *H01L 21/6875* (2013.01)

(58) Field of Classification Search
CPC .......... H01L 21/6838; H01L 21/670952; H01L 21/6875; B32B 37/14; B32B 37/10
(Continued)

(56) References Cited

U.S. PATENT DOCUMENTS 5,534,073 A * 7/1996 Kinoshita ............. B25B 11/005
118/725
6,280,308 B1 * 8/2001 Ishikawa ............. H01L 21/6835
451/289
(Continued)

FOREIGN PATENT DOCUMENTS

EP    1788617 A1    5/2007
JP    S61-145829 A    7/1986
(Continued)

OTHER PUBLICATIONS

Jul. 13, 2016—(TW) Notification of the Examination Option—App 103133327.
(Continued)

*Primary Examiner* — Michael N Orlando
*Assistant Examiner* — Christian Roldan
(74) *Attorney, Agent, or Firm* — Chunhsi Andy Mu

(57) ABSTRACT

A suction stage may include a mounting section configured to mount a first substrate, and an evacuation section configured to evacuate air between the first substrate and the mounting section. The mounting section includes a ring-shaped first wall part, and a ring-shaped second wall part inside the first wall part. The evacuation section includes a first control valve between the evacuation section and a first region between the first and second wall parts, a second control valve between the evacuation section and a second region inside the second wall part, and a control section configured to control the valves. The control section is configured to control the valves so that suction and non-
(Continued)

suction of the first substrate are alternately performed in at least one of the regions. Thus, suction of the first substrate may be deactivated in one of the regions, while the suction is active in the other region.

14 Claims, 5 Drawing Sheets

(51) Int. Cl.
  *H01L 21/687* (2006.01)
  *B32B 37/10* (2006.01)
  *B32B 37/14* (2006.01)
(58) Field of Classification Search
  USPC .......................................................... 156/285
  See application file for complete search history.

(56) References Cited

U.S. PATENT DOCUMENTS

| | | | |
|---|---|---|---|
| 6,451,670 B1 | 9/2002 | Takisawa et al. | |
| 6,706,618 B2 | 3/2004 | Takisawa et al. | |
| 8,157,615 B2* | 4/2012 | Thallner | B32B 43/006 |
| | | | 451/289 |
| 8,705,008 B2 | 4/2014 | Shibazaki | |
| 8,748,780 B2* | 6/2014 | Moro | C23C 14/541 |
| | | | 118/59 |
| 2002/0034859 A1* | 3/2002 | Takisawa | H01L 21/2007 |
| | | | 438/455 |
| 2002/0182038 A1 | 12/2002 | Takisawa et al. | |
| 2007/0177125 A1 | 8/2007 | Shibazaki | |
| 2008/0171131 A1 | 7/2008 | Moro et al. | |
| 2013/0025114 A1* | 1/2013 | Mizubata | H01L 21/6838 |
| | | | 29/559 |
| 2014/0072774 A1* | 3/2014 | Kito | H01L 21/67092 |
| | | | 428/174 |
| 2014/0226144 A1 | 8/2014 | Shibazaki | |

FOREIGN PATENT DOCUMENTS

| | | |
|---|---|---|
| JP | S62-221130 A | 9/1987 |
| JP | H10-242255 A | 9/1998 |
| JP | H11-74164 A | 3/1999 |
| JP | 2005-302858 A | 10/2005 |
| JP | 2012-186245 A | 9/2012 |
| JP | 2013-120902 A | 6/2013 |
| KR | 2006-0122557 A | 11/2006 |
| TW | 480617 B | 3/2002 |
| TW | 201304034 A | 1/2013 |
| WO | 2012/121046 A1 | 9/2012 |

OTHER PUBLICATIONS

Feb. 26, 2018—(KR) Examination Results—App 10-2016-7010101.
Dec. 16, 2014—International Search Report—Intl App PCT/JP2014/075274.
Apr. 4, 2017—(EP) Extended Search Report—App 14846963.8.

* cited by examiner

SUCTION STAGE, LAMINATION DEVICE, AND METHOD FOR MANUFACTURING LAMINATED SUBSTRATE

TECHNICAL FIELD

Embodiments of the invention relates to a suction stage, a lamination device, and a manufacturing laminated substrate.

BACKGROUND ART

There is known a suction stage for sucking a substrate such as a wafer.

Such a suction stage is used in e.g. a substrate lamination step in manufacturing a semiconductor device (see, e.g., Patent Literature 1).

In the substrate lamination step, the lamination surfaces of two substrates are laminated to each other to form one substrate.

For instance, the lamination surfaces of two substrates are laminated to each other to form one substrate in the case of e.g. manufacturing what is called an SOI (silicon on insulator) wafer and bonding a glass substrate to a silicon substrate by anode bonding technique.

According to such techniques, substrates can be laminated to each other without interposing e.g. an adhesive between the substrates. This can diversify the process condition in the treatment after lamination (such as plasma treatment, heat treatment, and chemical treatment). Furthermore, this can facilitate e.g. p-n junction and embedding of an insulating film.

However, deformed substrates such as warped substrates are difficult to laminate accurately.

CITATION LIST

Patent Literature

[Patent Literature 1] JP S61-145839 A

SUMMARY OF INVENTION

Technical Problem

The problem to be solved by the invention is to provide a suction stage, a lamination device, and a method for manufacturing a laminated substrate capable of accurately laminating even deformed substrates.

Technical Solution

According to the embodiment, a suction stage includes a mounting section configured to mount a first substrate, and an evacuation section configured to evacuate air between the first substrate and the mounting section.

The mounting section includes a first wall part provided on an outer peripheral side of one end surface of the mounting section and shaped like a ring, and a second wall part provided inside the first wall part and shaped like a ring.

The evacuation section includes a first control valve provided between the evacuation section and a first region between the first wall part and the second wall part, a second control valve provided between the evacuation section and a second region inside the second wall part, and a control section configured to control the first control valve and the second control valve.

The control section is configured to control the first control valve and the second control valve so that suction of the first substrate and deactivation of the suction of the first substrate are alternately performed in at least one of the first region and the second region.

While the suction of the first substrate is deactivated in one of the first region and the second region, the suction of the first substrate is performed in the other region.

Effect of the Invention

The suction stage, the lamination device, and the method for manufacturing the laminated substrate capable of accurately laminating even deformed substrates is provided by the embodiment of the invention.

DESCRIPTION OF EMBODIMENTS

Figure 1:
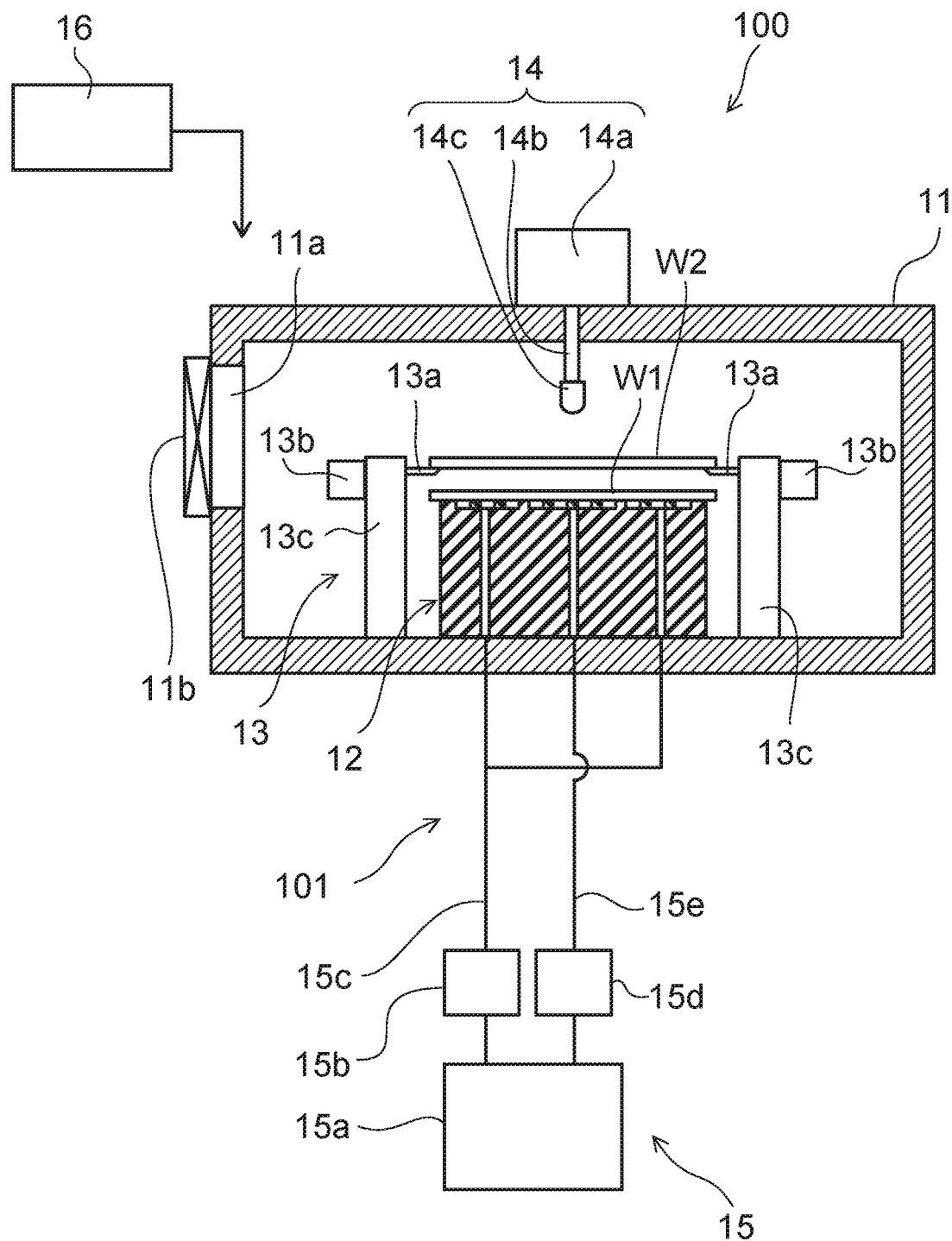
FIG. 1 is a schematic view for illustrating a suction stage 101 and a lamination device 100 according to this embodiment.

Embodiments will now be illustrated with reference to the drawings. In the drawings, similar components are labeled with like reference numerals, and the detailed description thereof is omitted appropriately.

FIG. 1 is a schematic view for illustrating a suction stage 101 and a lamination device 100 according to this embodiment.

Figure 2:
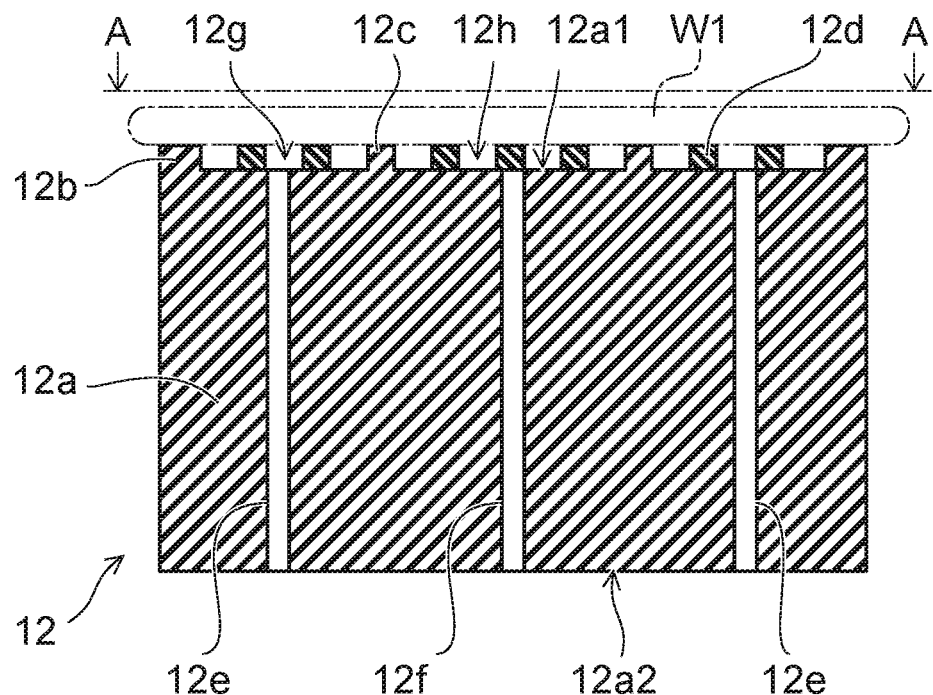
FIG. 2 is a schematic view for illustrating a mounting section 12.

FIG. 2 is a schematic view for illustrating a mounting section 12.

Figure 3:
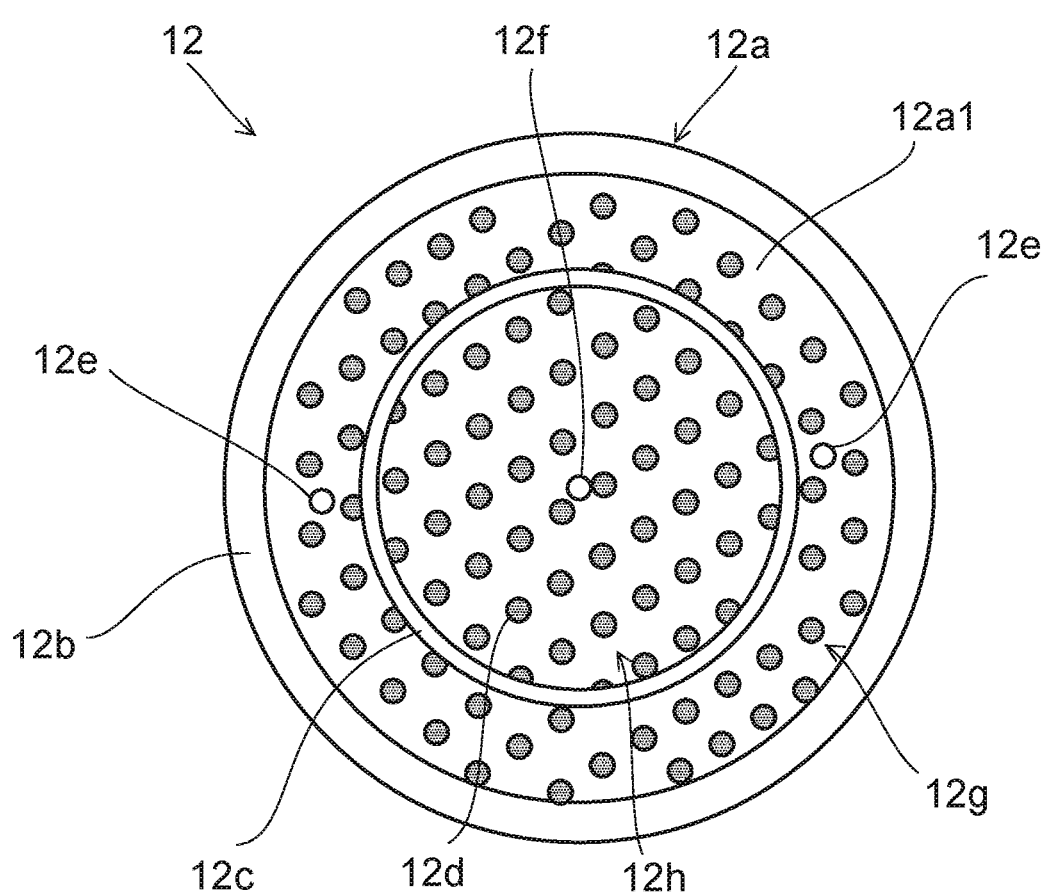
FIG. 3 is an arrow view taken along line A-A in FIG. 2.

FIG. 3 is an arrow view taken along line A-A in FIG. 2.

As shown in FIG. 1, the lamination device 100 includes a treatment chamber 11, a mounting section 12, a substrate support section 13, a pressing section 14, an evacuation section 15, and a control section 16.

The suction stage 101 according to this embodiment includes the mounting section 12, the evacuation section 15, and the control section 16.

The treatment chamber 11 is shaped like a box having an air-tight structure.

The sidewall of the treatment chamber 11 is provided with an opening 11$a$ for carry-in/out of e.g. a substrate W1 (corresponding to an example of the first substrate) and a substrate W2 (corresponding to an example of the second substrate). Furthermore, the sidewall of the treatment chamber 11 is provided with a gate 11$b$ capable of air-tightly opening/closing the opening 11$a$.

The mounting section 12 is provided on the inner bottom surface of the treatment chamber 11.

As shown in FIGS. 2 and 3, the mounting section 12 includes a body part 12a, a wall part 12b (corresponding to an example of the first wall part), a wall part 12c (corresponding to an example of the second wall part), a support part 12d, a hole part 12e, and a hole part 12f.

In FIG. 3, part of the support part 12d is not shown to avoid complexity.

The body part 12a is shaped like a cylinder.

Although the body part 12a shaped like a cylinder is illustrated, the shape of the body part 12a can be appropriately changed depending on e.g. the shape of the substrate W1 mounted thereon. For instance, the body part 12a may be shaped like a prism.

The wall part 12b is provided on the end surface 12a1 of the body part 12a on the side on which the substrate W1 is to be mounted. The wall part 12b is shaped like a ring and surrounds the outer periphery of the body part 12a.

The wall part 12c is provided on the end surface 12a1 of the body part 12a. The wall part 12c is provided inside the wall part 12b. The wall part 12c is shaped like a ring. The height dimension (dimension from the end surface 12a1 to the top surface) of the wall part 12c is equal to the height dimension of the wall part 12b.

The wall part 12b and the wall part 12c thus provided partition the end surface 12a1 of the body part 12a into two regions. That is, the end surface 12a1 is partitioned into a region 12g (corresponding to an example of the first region) located between the wall part 12b and the wall part 12c, and a region 12h (corresponding to an example of the second region) located inside the wall part 12c.

Thus, as described later, suction of the substrate W1 can be separately controlled on the outer peripheral side and the central part side. Furthermore, the area of the top surface of the wall part 12b and the area of the top surface of the wall part 12c are small. This can reduce the influence on the suction performance.

Furthermore, because the area of the top surface of the wall part 12b and the area of the top surface of the wall part 12c are small, the deformation of the substrate W1 can be rectified without the influence of the shape of the top surface of the wall part 12b and the top surface of the wall part 12c.

In plan view, the area of the region 12g is equal to the area of the region 12h.

When the area of the region 12g is equal to the area of the region 12h in plan view, the suction force per unit area occurring in each region can be made equal.

Alternatively, when the suction amount through the hole part 12e in the region 12g is equal to the suction amount through the hole part 12f in the region 12h, the suction force per unit area occurring in each region can be made equal. That is, the suction amount only needs to be made equal in the region 12g and the region 12h. As a result, strain-free suction can be performed in each region.

The wall part 12b and the wall part 12c are provided in the illustrated example. However, another wall part can be further provided inside each of the wall part 12b and the wall part 12c.

That is, the end surface 12a1 of the body part 12a can be partitioned into three or more regions.

The support part 12d is shaped like a column and provided on the end surface 12a1 of the body part 12a. The height dimension (dimension from the end surface 12a1 to the top surface) of the support part 12d is equal to the height dimension of the wall part 12b. That is, the wall part 12b, the wall part 12c, and the support part 12d are equal in height dimension. Thus, the surface including the top surfaces of the wall part 12b, the wall part 12c, and the support part 12d constitutes a mounting surface of the mounting section 12.

In the example illustrated in FIGS. 1 and 2, the mounting surface of the mounting section 12 is a flat surface. The mounting surface of the mounting section 12 is not limited to a flat surface, but can be appropriately changed. For instance, the mounting surface of the mounting section 12 may be a convex or concave curved surface.

The support part 12d illustrated in FIGS. 2 and 3 is shaped like a cylinder. However, for instance, the support part 12d may be shaped like a truncated cone, a truncated pyramid, or a sphere. The top surface of the support part 12d constitutes the mounting surface of the substrate W1. Thus, the support part 12d shaped like a truncated cone, a truncated pyramid, or a sphere can reduce the contact area with the substrate W1 compared with the cylindrical support part. This can suppress e.g. soiling of the substrate W1 and generation of particles.

The area of the top surface of the support part 12d is small. This can reduce the probability that particles are attached to the top surface of the support part 12d constituting the mounting surface of the substrate W1. This can suppress the decrease of suction performance due to particles.

The support part 12d is provided in a plurality. The dimension between the adjacent support parts 12d is equal.

That is, the plurality of support parts 12d are equally spaced. If the spacing of the support parts 12d is too wide, the substrate W1 may locally bend upon suction of the substrate W1. The spacing of the support parts 12d can be appropriately set by experiment or simulation.

The plurality of support parts 12d can be arranged in e.g. a concentric or zigzag configuration.

The hole part 12e penetrates through the body part 12a in the thickness direction. One end part of the hole part 12e is opened at the end surface 12a1 in the region 12g. The other end part of the hole part 12e is opened at the end surface 12a2 and connected to the evacuation section 15.

The hole part 12f penetrates through the body part 12a in the thickness direction. One end part of the hole part 12f is opened at the end surface 12a1 in the region 12h. The other end part of the hole part 12f is opened at the end surface 12a2 and connected to the evacuation section 15.

The diameter dimension of the opening at the end surface 12a1 of the hole part 12e and the hole part 12f is preferably 1 mm or less. The diameter dimension exceeding 1 mm may locally generate a strain in the substrate W1.

When the substrate W1 is mounted on the mounting section 12, the neighborhood of the outer periphery of the substrate W1 protrudes from the body part 12a.

In this case, a lift pin or the like, not shown, can be provided to push up the portion of the substrate W1 protruding from the body part 12a.

As shown in FIG. 1, the substrate support section 13 includes a support hook 13a, a mover 13b, and a base part 13c.

The support hook 13a supports the peripheral part of the substrate W2. By using the support hook 13a to support the substrate W2, the substrate W2 is supported at a prescribed position opposed to the substrate W1 mounted on the mounting section 12.

The mover 13b moves the support hook 13a between the position supporting the substrate W2 and the position retracted outward from the substrate W2. The mover 13b can include a control motor such as a servomotor and a pulse motor.

The base part 13c is shaped like a column and provided on the inner bottom surface of the treatment chamber 11. The support hook 13a and the mover 13b are provided near the end part of the base part 13c. In the illustrated example, one base part 13c is provided for each pair of the support hook 13a and the mover 13b. However, the embodiment is not limited thereto. For instance, one base part 13c can be provided with a plurality of support hooks 13a and movers 13b.

The number of disposed substrate support sections 13 is not particularly limited. However, preferably, the substrate support sections 13 are evenly disposed at three or more sites of the periphery of the substrate W2. This can stabilize the support state of the substrate W2.

The pressing section 14 includes a mover 14a, a moving shaft 14b, and a pad 14c.

The pressing section 14 is provided at a position opposed to the end surface 12a1 of the body part 12a. The pressing section 14 is provided at a position such that the pad 14c can press a generally central part of the substrate W2 supported by the support hook 13a.

The pressing section 14 bends the substrate W2 by using the pad 14c to press the generally central part of the substrate W2 supported by the support hook 13a. Thus, part of the lamination surface of the substrate W1 is brought into contact with part of the lamination surface of the substrate W2. The lamination surface of the substrate W1 and the substrate W2 refers to the surface of the substrate W1 and the substrate W2 opposed to each other.

The mover 14a is provided outside the treatment chamber 11. The mover 14a can include a control motor such as a servomotor and a pulse motor. Alternatively, the mover 14a can include e.g. a mechanism driven by pressure-controlled liquid (such as air cylinder).

The moving shaft 14b is provided through the wall surface of the treatment chamber 11. One end part side of the moving shaft 14b is connected to the mover 14a. The pad 14c is attached to the other end part side of the moving shaft 14b.

The tip portion of the pad 14c has a generally hemispherical shape, and the base part of the pad 14c is shaped like a cylinder. The pad 14c is formed from a soft elastic body so that the contact portion can be changed from a point contact to a surface contact when being pressed. Thus, the stress can be relaxed at the pressing point (bonding start position). This can suppress damage to the substrate W2. Furthermore, this can also suppress e.g. occurrence of voids, occurrence of cracking and chipping, occurrence of scratches, and occurrence of misalignment due to slippage. The pad 14c can be formed from a soft resin such as silicone rubber and fluororubber. In this case, the pad 14c formed from silicone rubber or fluororubber can suppress contamination of the substrate W2.

The pressing section 14 is not necessarily needed, but can be provided as needed.

For instance, lamination of the substrate W1 and the substrate W2 can be performed by the self-weight of the substrate W2 without pressing the substrate W2.

Alternatively, suction of the substrate W1 is deactivated, and the control valve 15d is controlled so as to introduce outside air toward the rear surface of the substrate W1. Thus, the substrate W1 can be deformed convexly so that the substrate W1 is brought into contact with the substrate W2.

Alternatively, a pressing section similar to the pressing section 12 is provided inside the mounting section 12. Thus, the rear surface of the substrate W1 is pressed toward the substrate W2. Accordingly, the substrate W1 can be deformed convexly so that the substrate W1 is brought into contact with the substrate W2.

The bonding start position does not necessarily need to be located at the center of the substrate W1, but may be located at e.g. the peripheral part of the substrate W1.

The evacuation section 15 includes an evacuation pump 15a, a control valve 15b (corresponding to an example of the first control valve), a piping 15c, a control valve 15d (corresponding to an example of the second control valve), and a piping 15e.

The evacuation pump 15a can be e.g. a dry pump.

One end of the control valve 15b is connected to the evacuation pump 15a. The other end of the control valve 15b is connected to the hole part 12e through the piping 15c.

One end of the control valve 15d is connected to the evacuation pump 15a. The other end of the control valve 15d is connected to the hole part 12f through the piping 15e.

The substrate W1 mounted on the mounting section 12 defines a space including the region 12g.

The control valve 15b switches between evacuation of the space including the region 12g (suction) and stoppage of the evacuation or introduction of outside air (deactivation of suction). That is, the control valve 15b switches between suction and deactivation of suction of the substrate W1 in the region 12g.

The "deactivation of suction" in this specification includes not only stoppage of suction (stoppage of evacuation) but also introduction of outside air.

The substrate W1 mounted on the mounting section 12 also defines a space including the region 12h.

The control valve 15d switches between evacuation of the space including the region 12h and stoppage of the evacuation or introduction of outside air. That is, the control valve 15d switches between suction and deactivation of suction of the substrate W1 in the region 12h.

The control section 16 controls the operation of each component provided in the lamination device 100.

The control section 16 can perform e.g. the following control.

The control section 16 controls the control valve 15b to switch between suction and deactivation of suction of the substrate W1 in the region 12g.

The control section 16 controls the control valve 15d to switch between suction and deactivation of suction of the substrate W1 in the region 12h.

The control section 16 controls start and stoppage of the evacuation pump 15a.

The control section 16 controls the mover 13b to control the position of the support hook 13a.

The control section 16 controls the mover 14a to control the position of the pad 14c.

The control section 16 controls the opening and closing operation of the gate 11b.

Next, the function of the suction stage 101 and a method for manufacturing a laminated substrate according to this embodiment are illustrated in conjunction with the function of the lamination device 100.

First, by a transport device, not shown, a substrate W1 is transported from the opening 11a into the treatment chamber 11. The gate 11b is opened by a driving section, not shown.

The substrate W1 transported into the treatment chamber 11 is mounted on the mounting section 12, i.e., on the wall part 12b, the wall part 12c, and the support part 12d.

Next, the suction stage 101 (the mounting section 12, the evacuation section 15, and the control section 16) is operated to hold the substrate W1 on the mounting section 12.

Here, the substrate W1 has a deformation such as warpage. Thus, it is difficult to bring the entirety of the substrate W1 into close contact with the mounting section 12 simply by sucking the substrate W1. For instance, sucking the substrate W1 having a deformation such as warpage in one suction operation may locally leave a portion not in close contact with the mounting section 12, i.e., the deformed portion. Leaving the deformed portion may deteriorate the positional accuracy of lamination of the substrate W1 and the substrate W2.

Thus, in this embodiment, the substrate W1 is sucked onto the mounting section 12 as follows.

First, suction of the substrate W1 is performed in one of the region 12g and the region 12h, and suction of the substrate W1 is deactivated in the other of the region 12g and the region 12h.

For instance, suction of the substrate W1 is performed in the region 12g, and suction of the substrate W1 is deactivated in the region 12h.

Alternatively, suction of the substrate W1 is performed in the region 12h, and suction of the substrate W1 is deactivated in the region 12g.

Next, an operation opposite to the foregoing is performed. That is, suction of the sucked region is deactivated, and suction of the suction-deactivated region is performed.

Thus, even the substrate W1 having a deformation such as warpage can be conformed to the shape of the mounting surface of the mounting section 12. That is, the substrate W1 having a deformation such as warpage can be rectified to an intended shape (the shape of the mounting surface of the mounting section 12). This can improve the positional accuracy of lamination of the substrate W1 and the substrate W2.

The suction and deactivation of suction can be repeated a plurality of times.

Then, even the substrate W1 having a large deformation such as warpage or the substrate W1 having a large thickness can be conformed to the shape of the mounting surface of the mounting section 12.

The number of repetition times of the suction and deactivation of suction can be appropriately changed.

In advance of starting the operation of suction and deactivation of suction, suction operation can be performed in the region 12g and the region 12h to perform suction of the entire surface of the substrate W1. Thus, the shape of the substrate W1 can be corrected to some extent in conformity with the mounting section 12. This can reduce the number of repetition times of the suction and deactivation of suction even in the case where the substrate W1 has a large amount of deformation.

Figure 4:
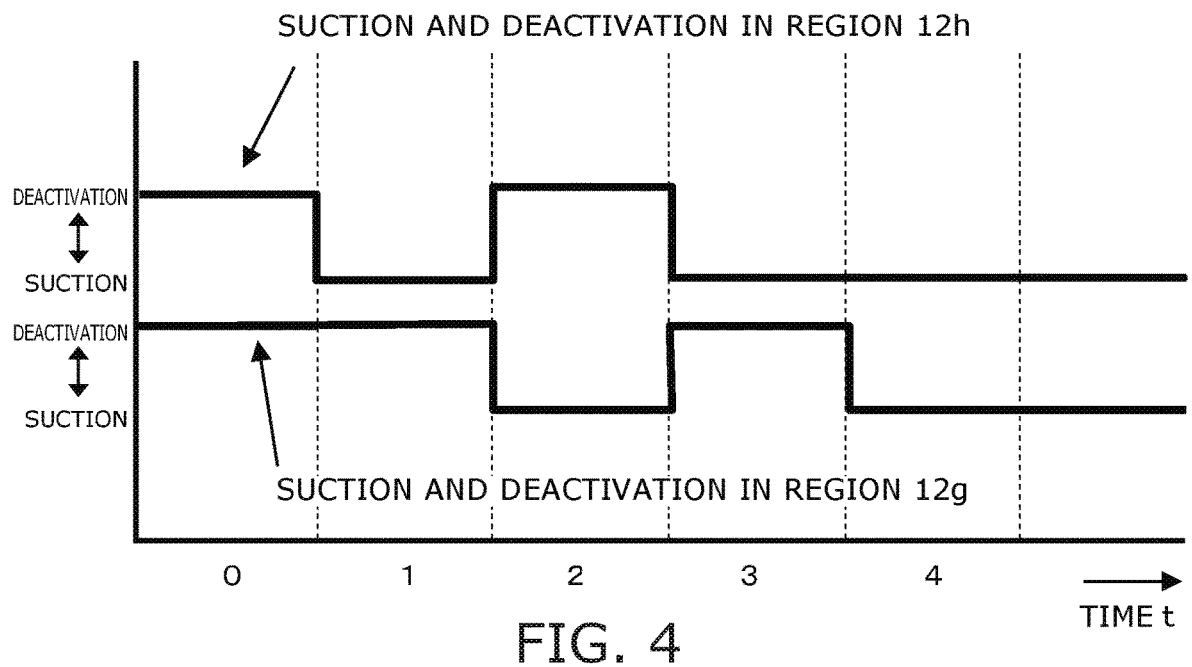
FIG. 4 is a timing chart of the operation of suction and deactivation of suction in the region 12$g$ and the region 12$h$.

FIG. 4 is a timing chart of the operation of suction and deactivation of suction in the region 12g and the region 12h.

Figure 5:
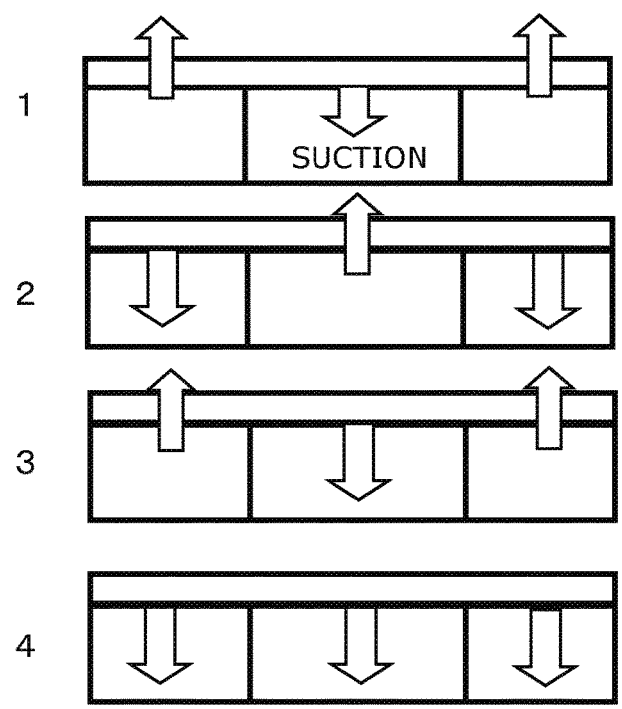
FIG. 5 is a schematic view for illustrating the operation of suction and deactivation of suction in each time slot.

FIG. 5 is a schematic view for illustrating the operation of suction and deactivation of suction in each time slot.

FIGS. 4 and 5 illustrate the case of alternately performing the operation of suction and deactivation of suction in the region 12g and the region 12h.

For instance, as shown in FIGS. 4 and 5, after performing suction of the substrate W1 in one of the region 12g and the region 12h, the suction of the substrate W1 is deactivated in the sucked region of the substrate W1.

While performing suction in one region, suction of the substrate W1 is deactivated in the other region.

Figure 6:
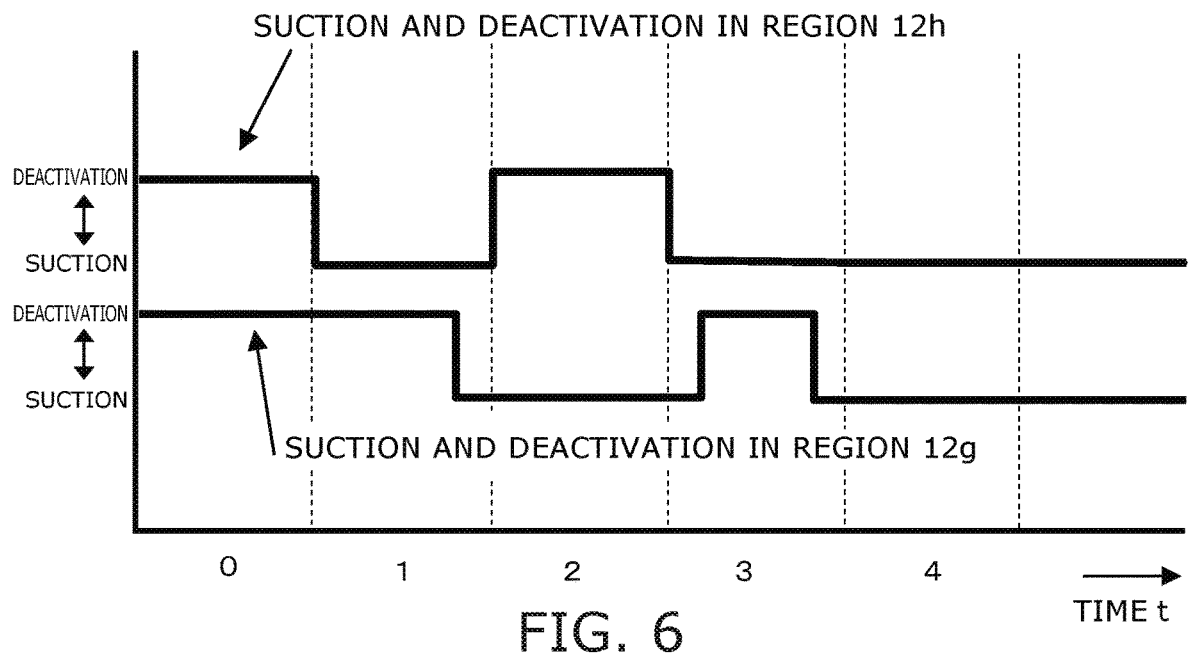
FIG. 6 is a timing chart of the operation of suction and deactivation of suction in the region 12$g$ and the region 12$h$.

FIG. 6 is a timing chart of the operation of suction and deactivation of suction in the region 12g and the region 12h.

Figure 7:
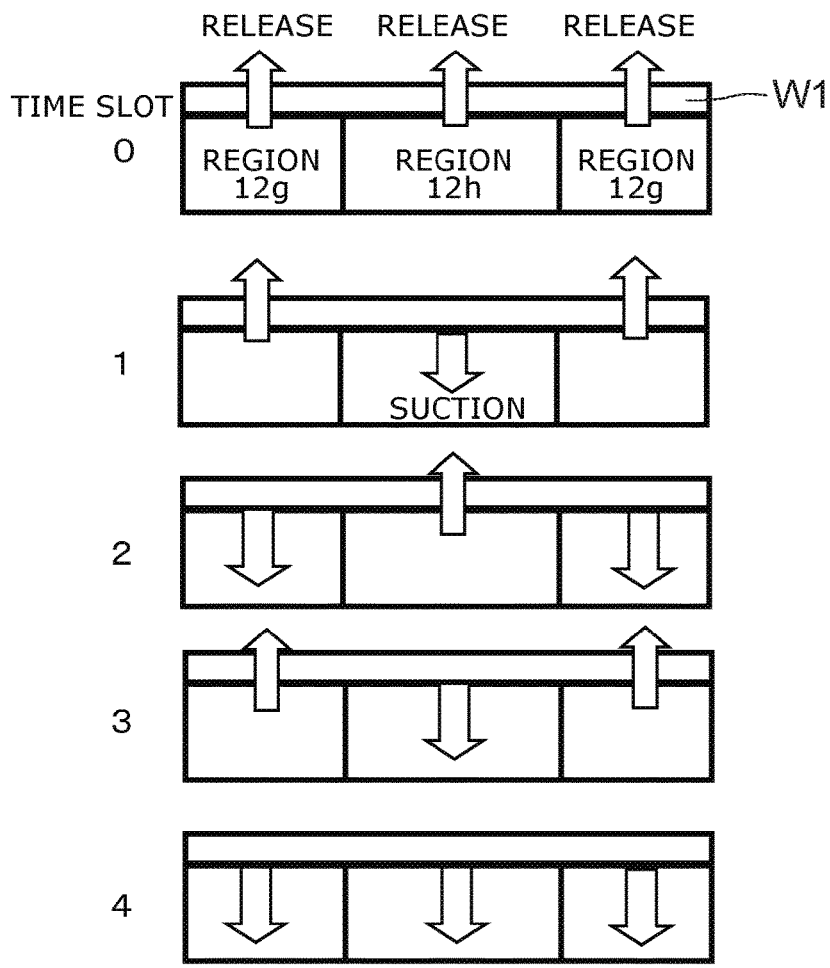
FIG. 7 is a schematic view for illustrating the operation of suction and deactivation of suction in each time slot.

FIG. 7 is a schematic view for illustrating the operation of suction and deactivation of suction in each time slot.

FIGS. 6 and 7 illustrate the case of alternately performing the operation of suction and deactivation of suction in the region 12g and the region 12h, while overlapping the suction operation in the region 12g and the region 12h.

For instance, as shown in FIGS. 6 and 7, suction of the suction-deactivated region is performed before deactivating the suction of the sucked region.

Then, suction is performed always in one or more regions. Thus, the substrate W1 can be conformed to the shape of the mounting surface of the mounting section 12 while reliably holding the substrate W1 without misalignment.

Figure 8:
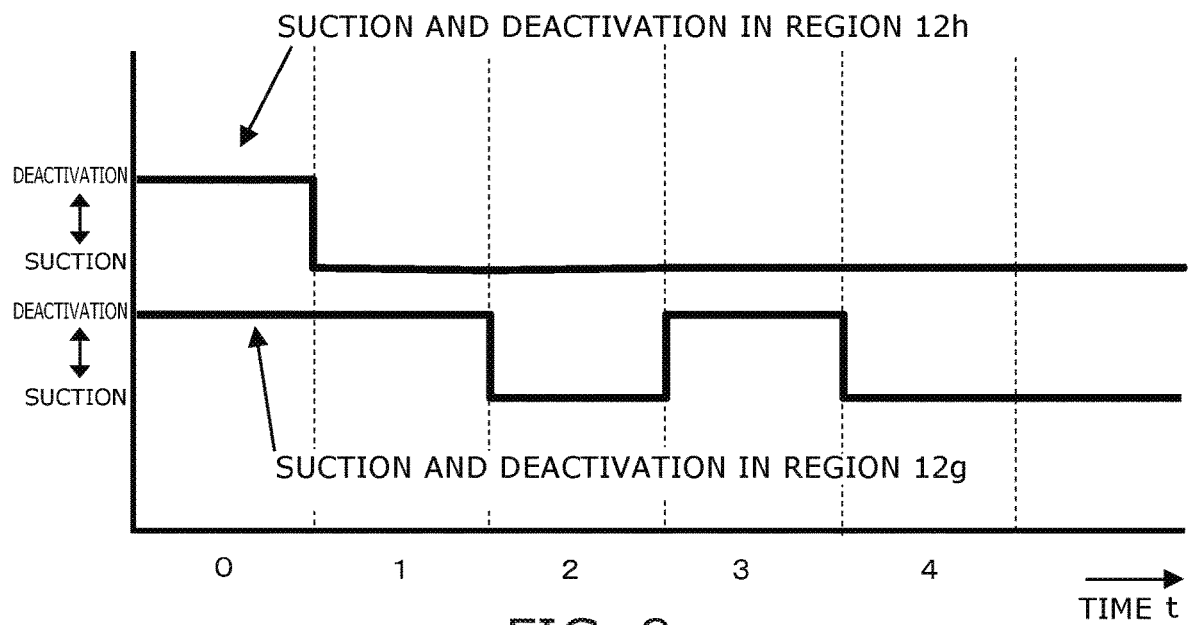
FIG. 8 is a timing chart of the operation of suction and deactivation of suction in the region 12$g$ and the region 12$h$.

FIG. 8 is a timing chart of the operation of suction and deactivation of suction in the region 12g and the region 12h.

Figure 9:
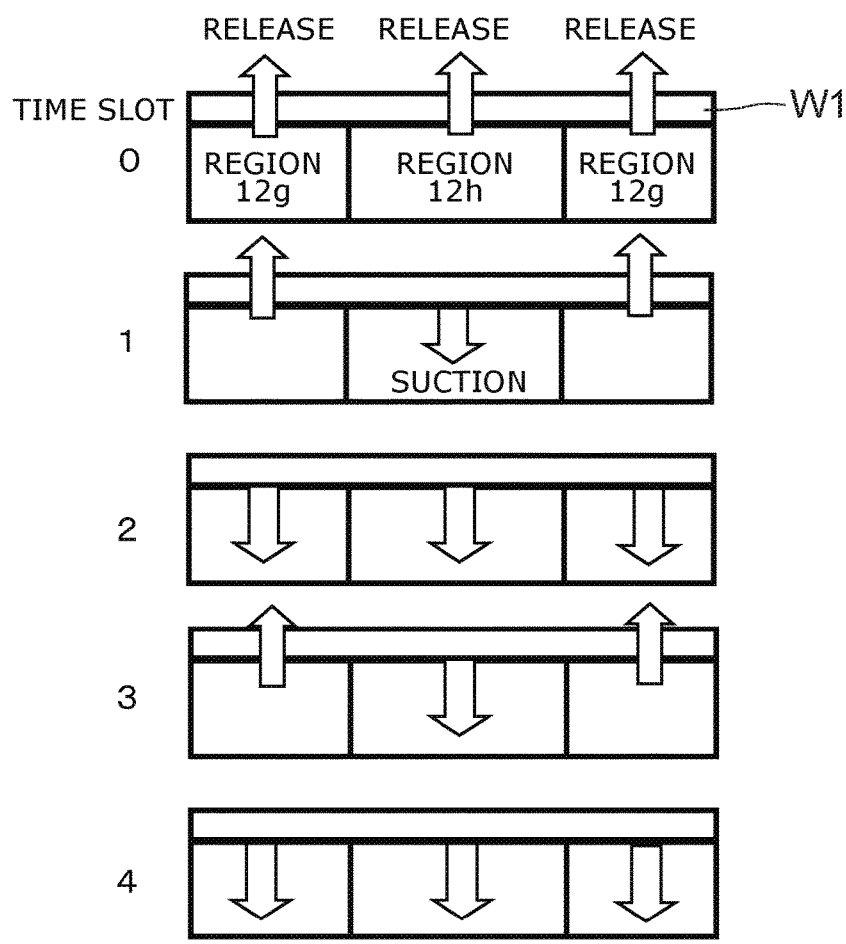
FIG. 9 is a schematic view for illustrating the operation of suction and deactivation of suction in each time slot.

FIG. 9 is a schematic view for illustrating the operation of suction and deactivation of suction in each time slot.

FIGS. 8 and 9 illustrate the case of performing suction in one region, and repeating suction and deactivation of suction in the other region.

For instance, as shown in FIGS. 8 and 9, suction is performed in the region 12h. Suction and deactivation of suction are repeated in the region 12g.

The region 12g is opposed to the peripheral portion of the substrate W1. Thus, the peripheral portion of the substrate W1 can be deformed in conformity with the shape of the mounting surface of the mounting section 12.

Then, the substrate W1 can be conformed to the shape of the mounting surface of the mounting section 12 while holding the substrate W1 in one region.

Subsequent to the suction and deactivation in one of the region 12g and the region 12h illustrated in FIGS. 4 to 9, suction is performed in the region 12g and the region 12h. Thus, the substrate W1 is sucked onto the mounting surface of the mounting section 12.

Next, by the transport device, not shown, a substrate W2 is transported from the opening 11a into the treatment chamber 11.

Then, the substrate W2 is mounted on the support hook 13a.

Next, the substrate W1 and the substrate W2 are laminated.

First, the gate 11b is closed to seal the treatment chamber 11.

Next, the generally central part of the substrate W2 supported by the support hook 13a is pressed by the pad 14c to bend the substrate W2. Thus, part of the lamination surface of the substrate W1 is brought into contact with part of the lamination surface of the substrate W2.

At this time, with the progress of lamination, the support hook 13a is gradually moved in the retraction direction.

The contact portion (laminated portion) of the lamination surface of the substrate W1 and the lamination surface of the substrate W2 expands from the central part toward the peripheral part.

When the peripheral part of the substrate W2 is disengaged from the support hook 13a, the lamination surface of the substrate W1 and the lamination surface of the substrate W2 are brought into contact in the entire surface. That is, the substrate W1 and the substrate W2 are laminated to form a laminated substrate.

Next, the pad 14c is raised.

The laminated substrate thus formed is transported to the outside of the treatment chamber 11 by the transport device, not shown.

Subsequently, lamination of the substrate W1 and the substrate W2 can be continuously performed by repeating the aforementioned procedure as needed.

The embodiments have been illustrated above. However, the invention is not limited to the above description.

Those skilled in the art can appropriately modify the above embodiments by addition, deletion, or design change of components, or by addition, omission, or condition change of steps. Such modifications are also encompassed within the scope of the invention as long as they include the features of the invention.

For instance, instead of performing suction and deactivation alternately once for each, suction and deactivation may be performed alternately a plurality of times for each.

For instance, the shape, dimension, material, arrangement, number and the like of the components of the lamination device 100 and the suction stage 101 are not limited to those illustrated, but can be appropriately changed.

The components of the embodiments described above can be combined with each other as long as feasible. Such combinations are also encompassed within the scope of the invention as long as they include the features of the invention.

INDUSTRIAL APPLICABILITY

As described above in detail, the invention can provide a suction stage, a lamination device, and a method for manufacturing a laminated substrate capable of accurately laminating even deformed substrates, achieving a significant advantage from the industrial viewpoint.

DESCRIPTION OF REFERENCE NUMERALS 11 treatment chamber
12 mounting section
12a body part
12a1 end surface
12b wall part
12c wall part
12d support part
12e hole part
12f hole part
12g region
12h region
13 substrate support section
14 pressing section
15 evacuation section
15a evacuation pump
15b control valve
15c piping
15d control valve
15e piping
16 control section
100 lamination device
101 suction stage
W1 substrate
W2 substrate

The invention claimed is:

1. A suction stage comprising:
a mounting section configured to mount a first substrate; and
an evacuation section configured to evacuate air between the first substrate and the mounting section,
the mounting section including:
a body part;
a first wall part provided on an outer peripheral side of one end surface of the body part and shaped like a ring;
a second wall part provided inside the first wall part in the one end surface of the body part, and shaped like a ring,
a plurality of support parts provided inside the first wall part, the plurality of support parts shaped like a cylinder, a truncated cone, a truncated pyramid, or a sphere; and
a surface including a top surface of the first wall part, a top surface of the second wall part, and top surfaces of the support parts constituting a mounting surface of the mounting section,
the evacuation section including:
an evacuation pump;
a first control valve provided between a first hole part and the evacuation pump, the first hole part provided in a first region between the first wall part and the second wall part, the first hole part penetrating through the body part in a thickness direction, one end of the first hole part opening in the first region on the one end surface of the body part, another end of the first hole part being connected to the evacuation pump via the first control valve, the first control valve switching between suction of the first substrate and deactivation of the suction of the first substrate in the first region;
a second control valve provided between a second hole part and the evacuation pump, the second hole part penetrating through the body part in a thickness direction, one end of the second hole part opening in a second region inside the second wall part, another end of the second hole part being connected to the evacuation pump via the second control valve, the second control valve switching between suction of the first substrate and deactivation of the suction of the first substrate in the second region; and
a control section configured to control the first control valve and the second control valve,
the control section being configured to control the first control valve and the second control valve so that suction of the first substrate and deactivation of the suction of the first substrate are alternately performed in at least one of the first region and the second region, and
while the suction of the first substrate is deactivated in one of the first region and the second region, the suction of the first substrate is performed in the other of the first region and the second region.

2. The suction stage according to claim 1, wherein the control section controls the first control valve and the second control valve so that the suction of the first substrate and the deactivation of the suction of the first substrate are performed alternately in the first region and the second region, respectively.

3. The suction stage according to claim 1, wherein the control section controls the first control valve and the second control valve so that the suction of the first substrate and the deactivation of the suction of the first substrate are performed alternately a plurality of times for each in the first region and the second region.

4. The suction stage according to claim 1, wherein the control section controls the first control valve and the second control valve so that before deactivating the suction of the first substrate in one of the first region and the second region, the suction of the first substrate is performed in the other of the first region and the second region.

5. The suction stage according to claim 1, wherein the control section controls the first control valve and the second control valve so that the suction of the first substrate and the deactivation of the suction of the first substrate are performed alternately in one of the first region and the second region, and while the suction and the deactivation of the suction of the first substrate are performed alternately in the one region, the suction of the first substrate is performed in the other of the first region and the second region.

6. The suction stage according to claim 1, wherein the mounting surface of the mounting section is a flat surface.

7. The suction stage according to claim 1, wherein the first wall part, the second wall part, and the plurality of support parts are equal in a height dimension.

8. The suction stage according to claim 1, wherein the mounting surface of the mounting section is a convex or concave curved surface.

9. The suction stage according to claim 1, wherein the plurality of support parts are equally spaced.

10. The suction stage according to claim 1, wherein the plurality of support parts are arranged in a concentric or zigzag configuration.

11. The suction stage according to claim 1, wherein, in plan view, a size of the mounting section is smaller than a size of the first substrate.

12. The suction stage according to claim 1, wherein, in plan view, an area of the first region is equal to an area of the second region.

13. The suction stage according to claim 12, wherein a suction amount in the first region by the evacuation pump is equal to a suction amount in the second region by the evacuation pump.

14. The suction stage according to claim 1, wherein a diameter dimension of an opening at the first region of the first hole part is 1 mm or less, and wherein a diameter dimension of an opening at the second region of the second hole part is 1 mm or less.

* * * * *